United States Patent
Waldvogel et al.

(10) Patent No.: US 6,861,746 B1
(45) Date of Patent: Mar. 1, 2005

(54) ELECTRICAL CIRCUIT APPARATUS AND METHODS FOR ASSEMBLING SAME

(75) Inventors: John M. Waldvogel, Libertyville, IL (US); Brian R. Bielick, Carpentersville, IL (US); Herman J. Miller, Algonquin, IL (US); Billy J. Van Cannon, Chicago, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/677,456

(22) Filed: Oct. 2, 2003

(51) Int. Cl.[7] .............. H01L 23/10; H01L 23/12; H01L 23/34; H01L 23/48; H01L 23/52
(52) U.S. Cl. .............. 257/706; 257/711; 257/712; 257/713; 257/774; 257/778; 257/782; 257/783
(58) Field of Search .............. 257/706, 711–713, 257/774, 778, 782, 783

(56) References Cited

U.S. PATENT DOCUMENTS 5,646,444 A 7/1997 Bartlett et al.
6,770,967 B2 * 8/2004 Barcley .............. 257/706

* cited by examiner

Primary Examiner—Nitin Parekh
(74) Attorney, Agent, or Firm—Valerie M. Davis

(57) ABSTRACT

An electrical circuit apparatus (300) that includes: a substrate (330) having a ground layer (336), at least one thermal aperture (332), and at least one solder aperture (334); a heat sink (310); and an adhesive layer (320) for mechanically coupling the heat sink to the ground layer of the substrate such that at least a portion of the at least one substrate thermal aperture overlaps the heat sink, the adhesive layer having at least one thermal aperture (322) and at least one solder aperture (324), wherein aligning the at least one substrate solder aperture with the at least one adhesive layer solder aperture and aligning the at least one substrate thermal aperture with the at least one adhesive layer thermal aperture enables solder wetting in a predetermined area between the heat sink and the ground layer of the substrate.

31 Claims, 6 Drawing Sheets

US 6,861,746 B1

ELECTRICAL CIRCUIT APPARATUS AND METHODS FOR ASSEMBLING SAME

REFERENCE TO RELATED APPLICATIONS

The present application is related to the following U.S. application commonly owned together with this application by Motorola, Inc.:

Ser. No. 10/677,458, filed Oct. 2, 2003, titled "Electrical Circuit Apparatus and Method for Assembling Same" by Waldvogel, et al.

FIELD OF THE INVENTION

The present invention relates generally to methods and electrical circuit apparatus, wherein components are mounted to a circuit board.

BACKGROUND OF THE INVENTION

When constructing power amplifiers various components must be mounted to a circuit board or substrate. Many of these components are mounted to a top side of the circuit board using a known solder reflow process. For instance, a load resistor having at least one input terminal and having a ground portion or flange may be mounted to the top side of the circuit board. When mounting a load resistor to a circuit board, three factors must be balanced. First, the load resistor must have a proper and sufficient electrical connection to the circuit board, wherein the input terminals are soldered to the top side of the circuit board and the ground flange is sufficiently coupled to a heat sink that is typically soldered locally to the underside of the circuit board in an area primarily surrounding the load resistor. In addition, a sufficient thermal conduction path must be established between the load resistor and the heat sink. Moreover, load resistors are typically made of a ceramic material, which presents a thermal expansion mismatch between the load resistor and the heat sink since the heat sink typically has a higher coefficient of thermal expansion (CTE) than the ceramic load resistor. This CTE mismatch can result in local distortion or warping of the circuit board after assembly. Solder joint reliability can also be significantly degraded in a thermal cycling application.

Other components that are mounted to the top side of the circuit board such as, for instance, an inductor coil may require an electrical isolation from a heat sink located below the component. These types of components may have both input and output terminals that are coupled to the top side of the circuit board, have heat dissipation needs and require a thermal conduction path to the heat sink below, but require an electrical isolation from the heat sink.

There are a number of methods used for mounting devices such as load resistors and inductor coils to a circuit board, including a hybrid manufacturing process using fixtures (i.e., a one pass solder reflow process) and a two pass solder reflow process. The hybrid manufacturing process is typically associated with ceramic circuit boards and possibly with carrier plates that serve as heat sinks. Due to the fragility of the substrate, large fixtures are usually required for its alignment and protection during processing. The use of fixtures usually forces manual processing.

One disadvantage of the hybrid manufacturing process is that it is more costly than other manufacturing methods primarily due to the added cost of the fixtures used in the process and also due to the need for a number of manual steps that generate a lower production throughput. An additional disadvantage is that manufacturing with fixtures produces a significant variation in part placement and solder attachment due to fixture tolerances or due to fixture degradation with repeated use.

Turning now to the two pass solder reflow process. During the first pass of the solder reflow process, a plurality of heat sinks are locally coupled to the ground layer of a circuit board in areas primarily surrounding where power components will be mounted. Thereafter, solder is placed in strategic areas on the board, and a plurality of components, including RF transistors, load resistors and inductor coils, are mounted onto and soldered to the board in a second pass of the reflow solder process.

A primary disadvantage of the two pass reflow process is that it requires one high-temperature reflow pass with a high melting temperature solder alloy, and a second subsequent reflow pass with a lower melting temperature solder allow. The first pass exposes the circuit board to high temperature, which can result in damage such as distortion. The requirement of two independent passes with different solder temperature settings limits manufacturing throughput. The two pass approach also does not lend itself well to no-lead solder because the first temperature needed to attach the heat sinks would have to exceed the elevated no-lead solder reflow temperature. This is a significant disadvantage because no-lead solder attachment may likely become a key product differentiator in the near future since some markets, especially European markets, are moving toward requiring no-lead solder attachment.

In addition, neither the hybrid manufacturing process nor the two pass solder reflow process addresses the thermal expansion mismatch issues that arise when mounting devices such as ceramic load resistors to a circuit board.

Thus, there exists a need for a cost effective method and electrical circuit apparatus wherein: components may be mounted to a circuit board without the need for fixtures; the process for assembling the electrical circuit apparatus is compatible with a single pass solder reflow process that is compatible with, but is not limited to no-lead solder; and any thermal expansion mismatch problems in the electrical circuit apparatus are addressed and, when possible, minimized.

BRIEF DESCRIPTION OF THE FIGURES

A preferred embodiment of the invention is now described, by way of example only, with reference to the accompanying figures in which.

DETAILED DESCRIPTION OF THE PREFERRED EMBODIMENT

Figure 1:
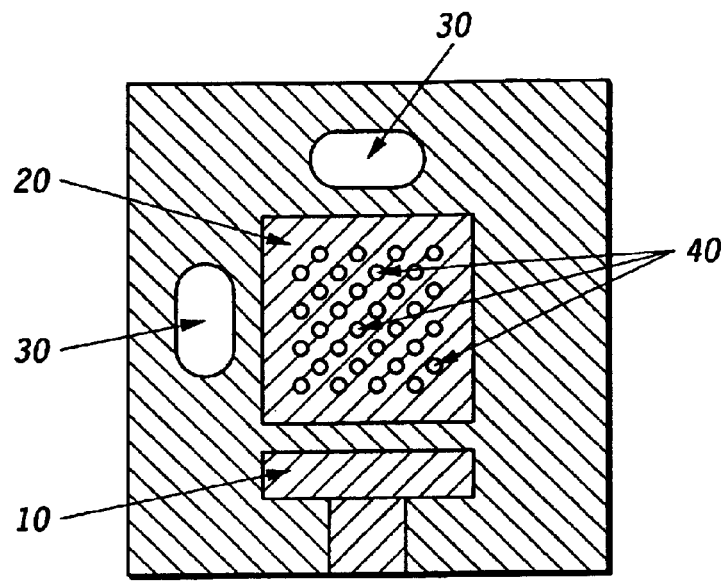
FIG. 1 illustrates a topside view of a schematic diagram of a portion of a substrate in accordance with an embodiment of the present invention.

While this invention is susceptible of embodiments in many different forms, there are shown in the figures and will herein be described in detail specific embodiments, with the understanding that the present disclosure is to be considered as an example of the principles of the invention and not intended to limit the invention to the specific embodiments shown and described. Further, the terms and words used herein are not to be considered limiting, but rather merely descriptive. It will also be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate corresponding elements.

The present invention includes a method and electrical circuit apparatus, wherein components may be mounted to a circuit board. In a first aspect of the invention, a device is mounted to the top side of the circuit board and has a primary heat extraction area that may be grounded.

FIG. 1 illustrates a topside view of a schematic diagram of a portion of a circuit board or substrate 100 in accordance with an embodiment of the present invention. In one embodiment, substrate 100 is an organic circuit board such as a printed circuit board (PCB). However, those of ordinary skill in the art will realize that other substrates (ceramic, for example) may be incorporated. Substrate 100 includes a ground layer (not shown), which may comprise a bottom side of the substrate or may, alternatively, exist internal to the top side and the bottom side of the substrate. The ground layer is typically comprised of copper, which may be coated or plated with a variety of protective layers (e.g., organic surface coating, tin, nickel or gold).

Substrate 100 may include pads 10 and 20 for enabling a component to be mounted on the topside of substrate 100. For instance, where a load resistor having at least one input terminal and a ground flange is being mounted to substrate 100, the input terminals may be coupled to the substrate at one pad 10, and the ground flange may be coupled to the substrate at the other pad 20.

Substrate 100 further includes at least one but typically a plurality of, thermal apertures (commonly referred to as thermal vias) 40, that are electrically and thermally conducting cut-outs extending through the substrate, for instance through pad 20, and by which a component may be coupled both electrically and thermally to a heat sink below for grounding of the component and for heat dissipation of the component. In one embodiment, a device such as a load resistor may be coupled to the heat sink via thermal apertures 40. However, it is appreciated that the device may be any device that is mounted in one region of the substrate, i.e., the top side of the substrate, but that can also be coupled to the heat sink below the substrate such as, for instance, surface mount transistors or chip capacitors.

Substrate 100 further includes solder apertures 30 that are cut-outs extending through the substrate for accommodating solder addition prior to solder wetting. Solder wetting is defined as the flow of molten solder due to surface tension forces along a surface or multiple surfaces away from the initial area of solder addition. The solder may be in the form of paste, pellets, etc., and may be leaded or no-lead solder. The placement, size and dimensions of the solder apertures 30 are predetermined and assist in causing solder wetting in a predetermined area, for instance, between a heat sink and the ground layer of the substrate 100. FIG. 1 illustrates two oval shaped solder apertures 30. The placement, size and dimensions of solder apertures 30 are exemplary for optimal solder wetting beneath a load resistor. However, those of ordinary skill in the art will realize that depending upon the particular component being mounted and the desired area for solder wetting, there may be more or fewer solder apertures in other locations on the substrate and having other sizes and dimensions.

Figure 2:
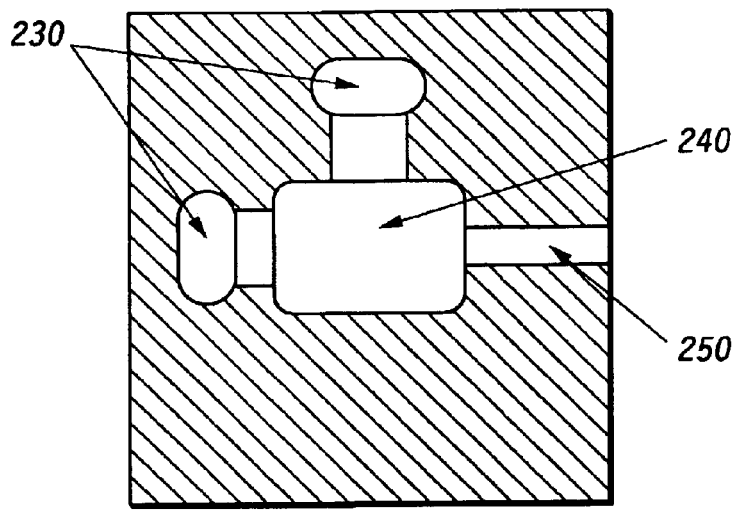
FIG. 2 illustrates a topside view of a schematic diagram of an adhesive layer in accordance with an embodiment of the present invention.

FIG. 2 illustrates a topside view of a schematic diagram of an adhesive layer 200 in accordance with an embodiment of the present invention. Adhesive layer 200 corresponds to substrate portion 100 of FIG. 1 and is used for mechanically coupling at least a portion of one heat sink to the ground layer of substrate 100 such that at least a portion of thermal apertures 40 overlap the heat sink.

Adhesive layer 200 is typically comprised of a flexible material with adhesive and cohesive properties that are stable over the high temperature of the reflow soldering process. The material is typically electrically non-conducting but may also be a conducting material. In one embodiment, the material is a flexible, pressure sensitive acrylic adhesive. In another embodiment, a flexible liquid or film adhesive requiring a curing process (e.g., elevated temperature) may be used. Adhesive layer 200 may be manufactured having a predetermined thickness, the purpose of which will be discussed below. Adhesive layer 200 includes at least one thermal aperture 240, wherein at least portion of the thermal aperture 240 is located beneath pad 20 of substrate 100 and also beneath at least a portion of a device mounted on top of substrate 100. Thermal aperture 240 is likewise a cut-out that extends through the adhesive layer and that has a size and dimensions that enables sufficient coupling between the device and the heat sink but that provides electrical isolation where needed between the device and the heat sink. Adhesive layer 200 further includes solder apertures 230 that correspond to solder apertures 30 in substrate 100. Solder apertures 230 are cut-outs that likewise extend through adhesive layer 200 for accommodating solder prior to solder wetting. At least one venting feature or aperture 250, which is an additional cut out in the adhesive layer, may be added in conjunction solder apertures 230. Venting feature 250 is typically located on a predetermined area of the adhesive layer 200 for enabling solder volatiles to escape for optimal solder wetting.

The placement, size and dimensions of solder apertures 230 are predetermined and may have portions that are essentially the same size and dimensions as that of solder apertures 30 in the substrate so that the aligning of solder apertures 30 with solder apertures 230, and the aligning of thermal apertures 40 with thermal aperture 240 provides for a precise cavity for guiding and controlling solder wetting from the solder apertures (30, 230) to a predetermined area, for instance, between a heat sink and the ground layer of substrate 100.

The venting feature 250 has no corresponding aperture in the substrate and functions to permit volatiles trapped within solder to escape during solder wetting. As such, the venting features typically extend to the edge of the heat sink after attachment. In the embodiment illustrated in FIG. 2, there is only one venting feature 250 illustrated, and it is located adjacent to the adhesive layer thermal aperture 240. However, it is appreciated that additional venting features may be used. Moreover, the size, dimension, number and placement of the venting features may be determined, for instance, as a function of the desired solder wetting between the substrate ground layer and the heat sink and as a function of the edge of the heat sink relative to the solder apertures 230 and the thermal aperture 240. The venting feature in this embodiment is an aperture through the adhesive layer, but it is understood that the venting feature may be one or more holes in the substrate as described by reference to FIGS. 8 and 10. The adhesive layer may, thus, be die-cut from an adhesive film or adhesive coated film for repeatability in producing the desired thickness and shape of the adhesive layer.

Figure 3:
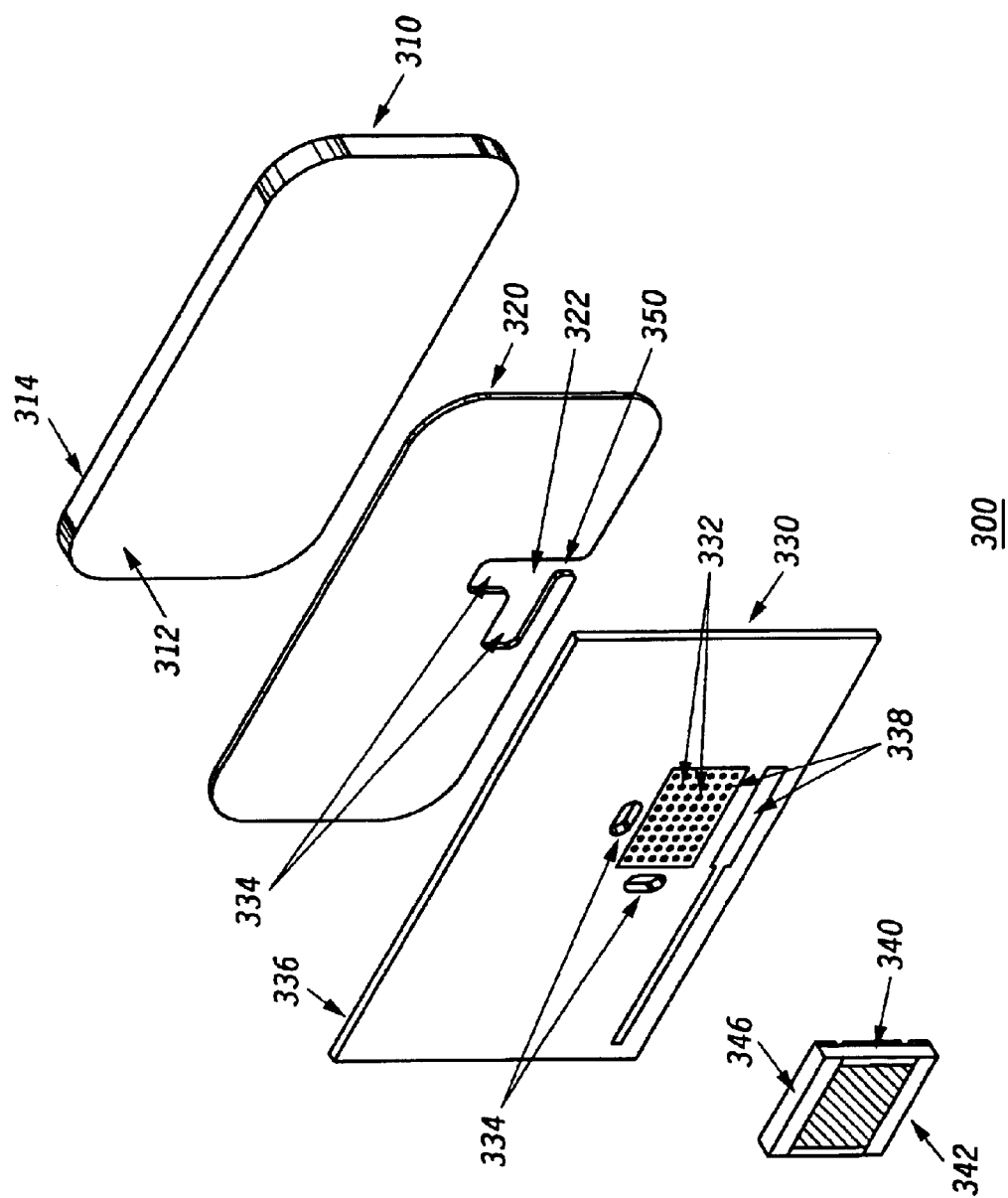
FIG. 3 illustrates an exploded view of electrical circuit apparatus including a heat sink, an adhesive layer, a substrate, and a ceramic device in accordance with an embodiment of the present invention.

FIG. 3 illustrates an exploded view of electrical circuit apparatus 300 in accordance with an embodiment of the present invention. Circuit apparatus 300 includes a heat sink 310, an adhesive layer 320, a substrate portion 330, and a device 340. Heat sink 310 may be comprised of a suitable high thermal conductive material such as, for instance, copper or aluminum, that allows wetting of solder and attachment of adhesive materials selected for the circuit apparatus assembly process. However, in another embodiment of the present invention, heat sink 310 may be comprised of a material having a coefficient of thermal expansion ("CTE") that is essentially matched to that of device 340 to minimize thermal expansion differences between device 340 and the heat sink 310. Heat sink 310 has two primary sides 312 and 314. At side 312: substrate portion 330 is attached using adhesive layer 320; device 340 is coupled using solder; and heat is input into heat sink 310 for dissipation. The opposite side 314 is the primary region of heat extraction from circuit apparatus 300, as well as the primary mounting surface for circuit apparatus 300. In one embodiment, the size of the heat sink is larger than that of the heat dissipating device (e.g., device 340), such that desirable heat spreading can be achieved.

Adhesive layer 320 is in accordance with the adhesive layer as described by reference to FIG. 2. Accordingly, adhesive layer 320 includes a thermal aperture 322, solder apertures 324, and a venting feature 350. Substrate portion 330 is in accordance with the substrate portion as described by reference to FIG. 1. Accordingly, substrate portion 330 includes thermal apertures 332, solder apertures 334, and a ground layer 336. Substrate 330 also typically includes a plurality of pads 338 on the topside of the substrate onto which the device 340 may be coupled and through which the substrate thermal apertures may extend. In the embodiment illustrated in FIG. 3, ground layer 336 comprises the bottom side of substrate 330. However, it is realized that ground layer 336 may be internal to substrate 330, wherein substrate 330 would further include a recess for exposing the ground layer, the recess typically having dimensions that are slightly larger than that of heat sink 310.

Finally, device 340 may comprise at least one input terminal 342 and a ground portion or flange 346. In one embodiment, device 340 is a load resistor. However, it is appreciated that device 340 may also be any device that is mounted on the top side of the substrate portion 330 but that may also be coupled to the heat sink 310. It is also appreciated that the load resistor is typically a ceramic device consisting of materials such as aluminum oxide, beryllium oxide or aluminum nitride having a low CTE, typically in the range 4 to 9 ppm/° C. Accordingly, in another aspect of the present invention heat sink 310 maybe selected having a material with a CTE that essentially matches that of the ceramic load resistor to minimize thermal expansion mismatch between the component and the heat sink.

The above-described elements of circuit apparatus 300 may be assembled as follows in accordance with the present invention. Adhesive layer 320 is aligned with substrate 330 such that adhesive layer thermal aperture 322 is aligned with substrate thermal apertures 332 and adhesive layer solder apertures 324 are aligned with substrate solder apertures 334. Heat sink 310 is mechanically coupled to the ground layer 336 of substrate 330 using adhesive layer 320, such that heat sink 310 is aligned with substrate 330 and at least a portion of thermal apertures 322 and 332 overlap heat sink 310. In the embodiment illustrated in FIG. 3, heat sink 310 is coupled locally to substrate 330 in an area that completely surrounds device 340 for providing an optimal thermal conduction path.

Solder is placed on the substrate pads (and thereby on at least a portion of the substrate thermal apertures), and into at least a portion of the adhesive layer solder apertures 324 for subsequent solder wetting to couple the device input terminals 342 to the substrate pads and to couple the device flange 346 to the heat sink 310, thereby grounding the device 340. Typically, solder paste is screen-printed on the substrate pads and into the solder apertures 324. However, in other embodiments, other forms of solder, e.g., solder pellets or pre-forms, may be implemented. It is further appreciated that during solder addition, solder may also be added to at least a portion of the substrate solder apertures 334. In fact, typically both the substrate and adhesive layer solder apertures (324, 334) are filled during solder addition.

The device 340 is mounted onto the topside of substrate 330 such that at least one input terminal 342 comes into contact with the solder on the corresponding pad on the topside of substrate 330 and at least a portion of the device flange 346 covers at least a portion of substrate thermal apertures 332. Population of the substrate 330 with the device 340 may be done manually, but is typically done using an automated process for efficiency and cost effectiveness during the manufacturing process. The populated substrate 330 may be placed in a reflow oven and thereafter cooled, wherein: a solder connection between the device inputs terminal 342 and the corresponding substrate pad is completed; solder wets through a least a portion of the substrate thermal apertures 332; and solder wets from the solder apertures (324, 334) into the cavity between the ground layer 336 and the heat sink 310 to complete the grounding and thermal coupling of device 340.

In one embodiment, at least a portion of the steps of the method according to the present invention described above may be performed as part of an automated process, and ideally all of the steps are so performed. However, it is realized that any of the above described steps in various combinations may be performed manually or as part of an automated process.

Mechanical attachment of the heat sink to the substrate prior to reflow eliminates the need for fixtures to hold the heat sink in place during the surface mount technology (SMT) processing and adds robustness during the assembly process for handling of the circuit apparatus assembly. Assembly of the electrical circuit apparatus may be performed during a single pass reflow process for the thermal coupling and device grounding and topside SMT attachment, thereby lending itself well with the use of no-lead solder or leaded solder.

The adhesive layer solder apertures, the substrate ground layer and the wettable heat sink surface promote wetting of solder from the solder apertures to areas of critical thermal transfer and RF grounding during reflow. High surface energy surfaces above (substrate ground layer) and below (heat sink) promote the wetting of solder to the open space between the two wettable surfaces. These surfaces also provide ideal adhesive bonding surfaces yielding high adhesion strength between the heat sink and the substrate. During solder addition, solder fills many of the substrate thermal apertures for subsequent solder wetting to produce a good thermal conduction path from the device to the heat sink, as well as a sufficient ground connection.

Use of a film adhesive with controlled thickness produces a highly repeatable separation, resulting in lower variation of this critical dimension for the manufacturing process. A venting feature may be created by extending the adhesive cut-out to the edge of the circuit board or through at least one venting hole formed in the circuit board. This venting feature further promotes optimal solder filling in the separation by allowing solder paste volatiles to escape. The size and shape of the solder apertures for the paste also defines the volume of molten solder to fill the separation and is easily controlled to optimize thermal coupling and RF grounding. The combination of this control of solder volume and the termination of the region of two high surface energy surfaces created by the cut-outs in the adhesive restricts the flow of molten solder to the region of interest. The resulting ground layer-to-heat sink solder connection produces repeatable thermal and RF ground paths from the load resistor to the heat sink, wherein the ground paths are directly beneath the body of the device for optimal electrical performance. A high thermal conductivity, low CTE heat sink is used in the electrical circuit apparatus to manage the power dissipation needs of the ceramic load resistor while also minimizing thermal expansion differences with the low CTE ceramic load resistor.

Since the bulk of the attachment of the heat sink to the substrate is accomplished using a low-stiffness adhesive, thermal expansion differences between the heat sink and matching components on top of the substrate (e.g., ceramic components, such as RF matching capacitors, that have a much lower coefficient of thermal expansion than the heat sink) are decoupled, thus improving the reliability of the components and corresponding solder joints. Moreover, the thermal apertures enable a good thermal conduction path between the ground flange of the device and the heat sink.

FIG. 3, for simplicity, illustrates a portion of a substrate having one component mounted thereon using methods described above in accordance with the present invention. However, those of ordinary skill in the art will realize that a substrate typically has a plurality of components. Those of ordinary skill in the art will further realize that although FIG. 3 illustrates heat sink 310 being coupled locally to substrate 330 beneath only one device 340, typically heat sink 310 is coupled locally beneath a plurality of devices for efficiency in manufacturing and to minimize manufacturing costs. In addition, FIG. 3 only shows one heat sink being coupled to substrate 330. However, it is appreciated that a plurality of heat sinks may be coupled to the substrate.

Figure 4:
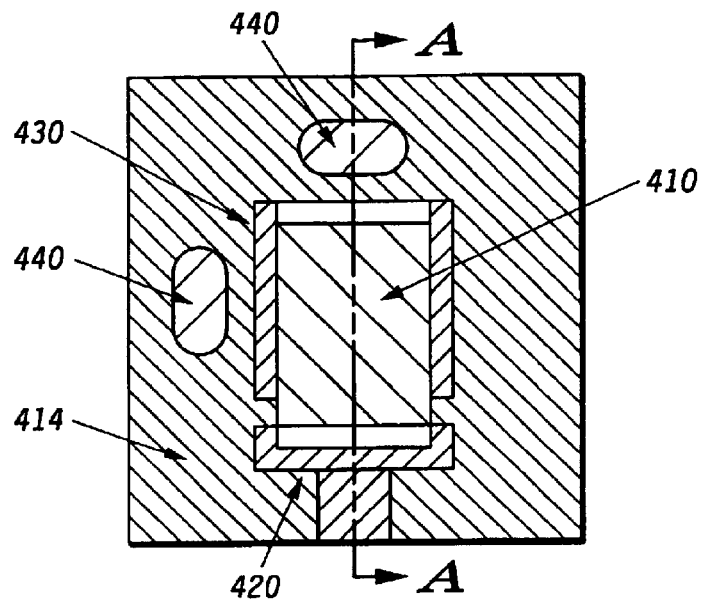
FIG. 4 illustrates an assembled topside view of electrical circuit apparatus in accordance with an embodiment of the present invention.

FIG. 4 illustrates an assembled topside view of an electrical circuit apparatus 400, in accordance with the electrical circuit apparatus illustrated in FIG. 3, subsequent to a solder paste screening and device population but prior to solder wetting. Illustrated in FIG. 4 is the topside of a device 410 that has been mounted onto a substrate 414, wherein the at least one device input terminal 420 has made contact with the solder on a pad (not shown) on the top side of the substrate 414, and a ground flange (not shown) has made contact with solder on another substrate pad 430 on the topside of the substrate 414. Also illustrated are two solder apertures 440 that have been filled with solder using known methods, and a cross-section line labeled A—A illustrates a cross-sectional area of the electrical circuit apparatus 400 that will be discussed in detail by reference to FIGS. 5 and 6.

Figure 5:
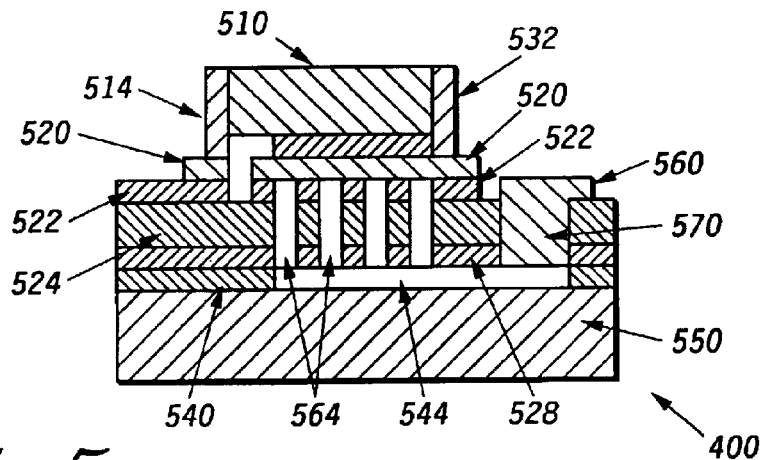
FIG. 5 illustrates a cross-sectional view at a section A—A of the electrical circuit apparatus illustrated in FIG. 4 prior to solder wetting.

FIG. 5 illustrates a cross-sectional view at a section A—A of the electrical circuit apparatus 400 illustrated in FIG. 4 prior to solder wetting. This cross-sectional view illustrates a device 510 having at least one input terminal 514 and a ground flange 532 coupled to pads 522 on a substrate 524 via a solder layer 520. At least a portion of ground flange 532 is mounted over a plurality of thermal apertures 564 that extend through substrate 524. A ground layer 528 of substrate 524 is mechanically coupled to a heat sink 550 via an adhesive layer 540, wherein the adhesive layer 540 creates a precise cavity 544 between the ground layer 528 and heat sink 550. Further illustrated is solder 560 that has been added using known methods into a solder aperture 570.

Figure 6:
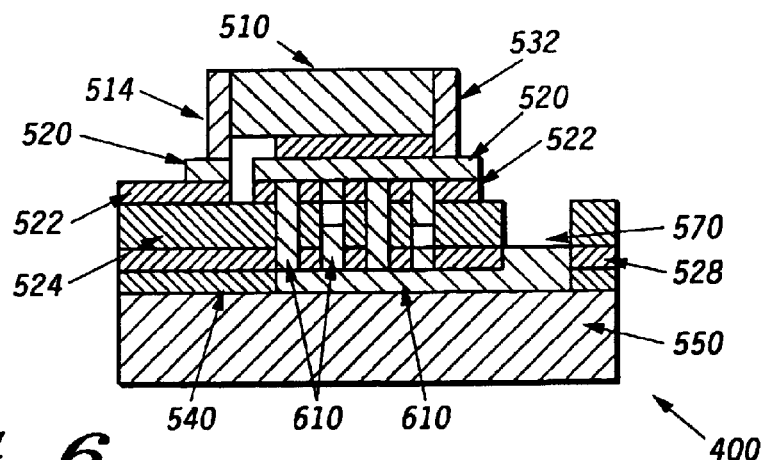
FIG. 6 illustrates a cross-sectional view at a section A—A of the electrical circuit apparatus illustrated in FIG. 4 subsequent to solder wetting.

FIG. 6 illustrates a cross-sectional view at a section A—A of the electrical circuit apparatus 400 illustrated in FIG. 4 subsequent to solder wetting. Those elements that are identical to the elements illustrated in FIG. 5 are correspondingly identically labeled in FIG. 6 and for the sake of brevity are not described again here. FIG. 6, however, further illustrates solder wetting 610 of solder 520 into at least a portion of the thermal apertures and of solder from solder aperture 570 into an area between the ground layer 528 of the substrate 524 and the heat sink 550, for thermal coupling and grounding between the device flange 532 and the heat sink 550, directly beneath the body of device 510.

Figure 7:
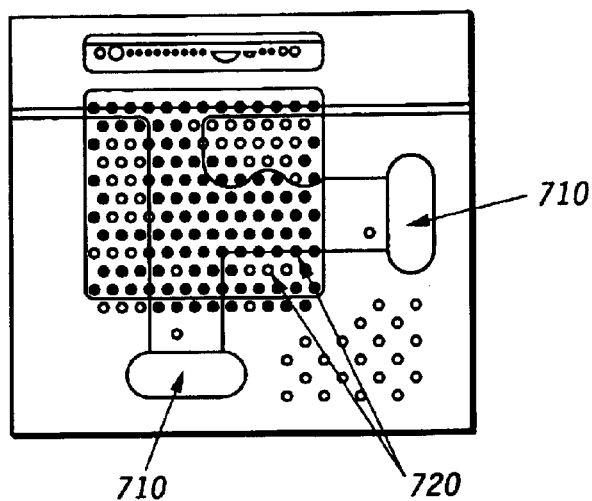
FIG. 7 illustrates an X-Ray image of an assembled electrical circuit apparatus in accordance with an embodiment of the present invention after device population and reflow soldering.

FIG. 7 illustrates an X-Ray image of an assembled electrical circuit apparatus in accordance with the present invention after device population and reflow soldering. This X-Ray image clearly shows how solder has wetted from solder apertures 710 and within thermal apertures 720 to produce ideal solder connections between the ground layer of the substrate and the heat sink and between the ground flange of the device and the heat sink in an area directly beneath the body of the device.

A number of exemplary advantages over the prior art can be realized using the method and electrical circuit apparatus of the present invention, wherein power devices may be mounted to a circuit board. These advantages include, but are not limited to: (1) minimization of thermal mismatch problems by matching the CTE of, for instance, a load resistor and the heat sink; (2) a good thermal path from the bottom of the device, though a plurality of thermal apertures, to a heat sink directly below; (3) repeatable solder attachment of the ground layer of the circuit board to the heat sink, directly under the device; (4) mechanical attachment of the heat sink to the circuit board to add robustness to assembly for handling and subsequent module assembly; (5) elimination of the need for fixtures in a one-step or single pass reflow soldering process that lends itself to no-lead solder or leaded solder; and (6) solder attachment for thermal management and for RF grounding can be accomplished during SMT attachment of other components to the circuit board without requiring additional process steps.

Figure 8:
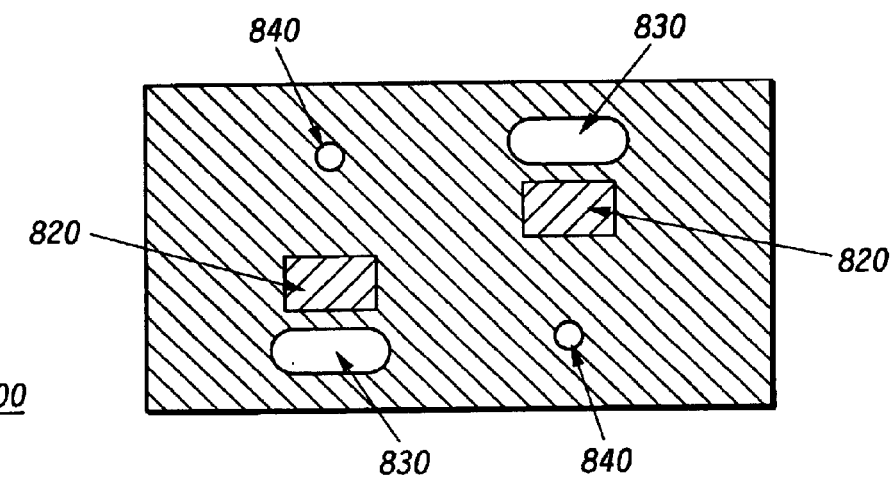
FIG. 8 illustrates a topside view of a schematic diagram of a portion of a substrate in accordance with an embodiment of the present invention.

In another aspect of the present invention, a device is mounted to the top side of a circuit board and requires heat dissipation via a heat sink mounted below the circuit board but also requires electrical isolation from the heat sink. FIG. 8 illustrates a topside view of a schematic diagram of a portion of a circuit board or substrate 800 in accordance with an embodiment of the present invention. In one embodiment, substrate 800 is an organic circuit board such as a printed circuit board (PCB). However, those of ordinary skill in the art will realize that other substrates (ceramic, for example) may be incorporated. Substrate 800 includes a ground layer (not shown), which may comprise a bottom side of the substrate or may, alternatively, exist internal to the top side and the bottom side of the substrate. The ground layer is typically comprised of copper, which may be coated or plated with a variety of protective layers (e.g., organic surface coating, tin, nickel or gold).

Substrate 800 may also include pads 820 for enabling a component to be mounted on the topside of substrate 800. For instance, where an inductor coil having at least one input terminal and at least one output terminal is being mounted to substrate 800, the input terminals may be coupled to the substrate at one pad 820, and the output terminals may be coupled to the substrate at the other pad 820.

Substrate 800 further includes solder apertures 830 that are cut-outs extending through the substrate for accommodating solder addition prior to solder wetting. The placement, size and dimensions of the solder apertures 830 are predetermined and assist in causing solder wetting in a predetermined area, for instance, between a heat sink and the ground layer of the substrate 800. FIG. 8 illustrates two oval shaped solder apertures 830. The placement, size and dimensions of solder apertures 830 are exemplary for optimal solder wetting beneath an inductive coil. However, those of ordinary skill in the art will realize that depending upon the particular component being mounted and the desired area for solder wetting, there may be more or fewer solder apertures in other locations on the substrate and having other sizes and dimensions. Substrate 800 may also include one or more venting holes 840 extending through the substrate and located in predetermined areas on the substrate. The venting holes 840 promote optimal solder wetting between the ground layer of the substrate and a heat sink by allowing solder volatiles to escape during solder reflow. FIG. 8 illustrates two circular shaped venting holes. However, it is appreciated that there may be more or fewer venting holes having different sizes, shapes, dimensions and locations on the substrate depending on the desired area of solder wetting. Moreover, it is appreciated that the venting of solder volatiles may, likewise, be accomplished using one or more venting apertures in the adhesive layer as described above by reference to FIGS. 2 and 3.

Figure 9:
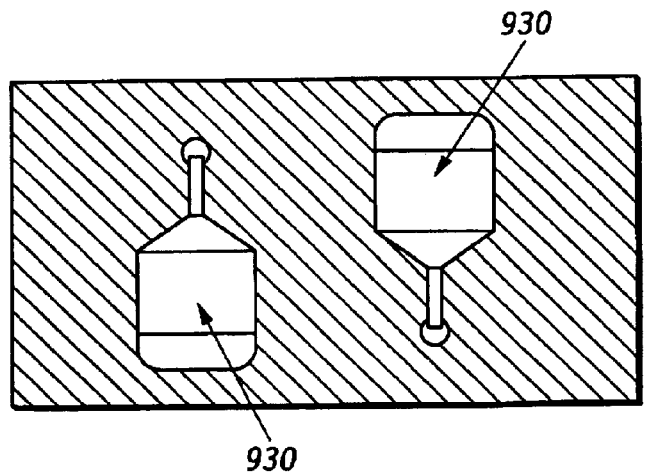
FIG. 9 illustrates a topside view of a schematic diagram of an adhesive layer in accordance with an embodiment of the present invention.

FIG. 9 illustrates a topside view of a schematic diagram of an adhesive layer 900 in accordance with an embodiment of the present invention. Adhesive layer 900 corresponds to substrate portion 800 of FIG. 8 and is used for mechanically coupling at least a portion of one heat sink to the ground layer of substrate 800.

Adhesive layer 900 is typically comprised of a flexible material with adhesive and cohesive properties that are stable over the high temperature of the reflow soldering process. The material is typically electrically non-conducting but may also be a conducting material. In one embodiment, the material is a flexible, pressure sensitive acrylic adhesive. In another embodiment, a flexible liquid or film adhesive requiring a curing process (e.g., elevated temperature) may be used. Adhesive layer 900 may be manufactured having a predetermined thickness. Adhesive layer 900 includes solder apertures 930 that correspond to solder apertures 830 and venting holes 840 in substrate 800. Solder apertures 930 are cut-outs that likewise extend through adhesive layer 900 for accommodating solder prior to solder wetting.

The placement, size and dimensions of solder apertures 930 are predetermined so that the aligning of solder apertures 830 and venting holes 840 with solder apertures 930 provides for a precise cavity for guiding and controlling solder wetting from the solder apertures (830, 930) to a predetermined area, for instance, between a heat sink and the ground layer of substrate 800. The adhesive layer may, thus, be die-cut from an adhesive film or adhesive coated film for repeatability in producing the desired thickness and shape of the adhesive layer.

Figure 10:
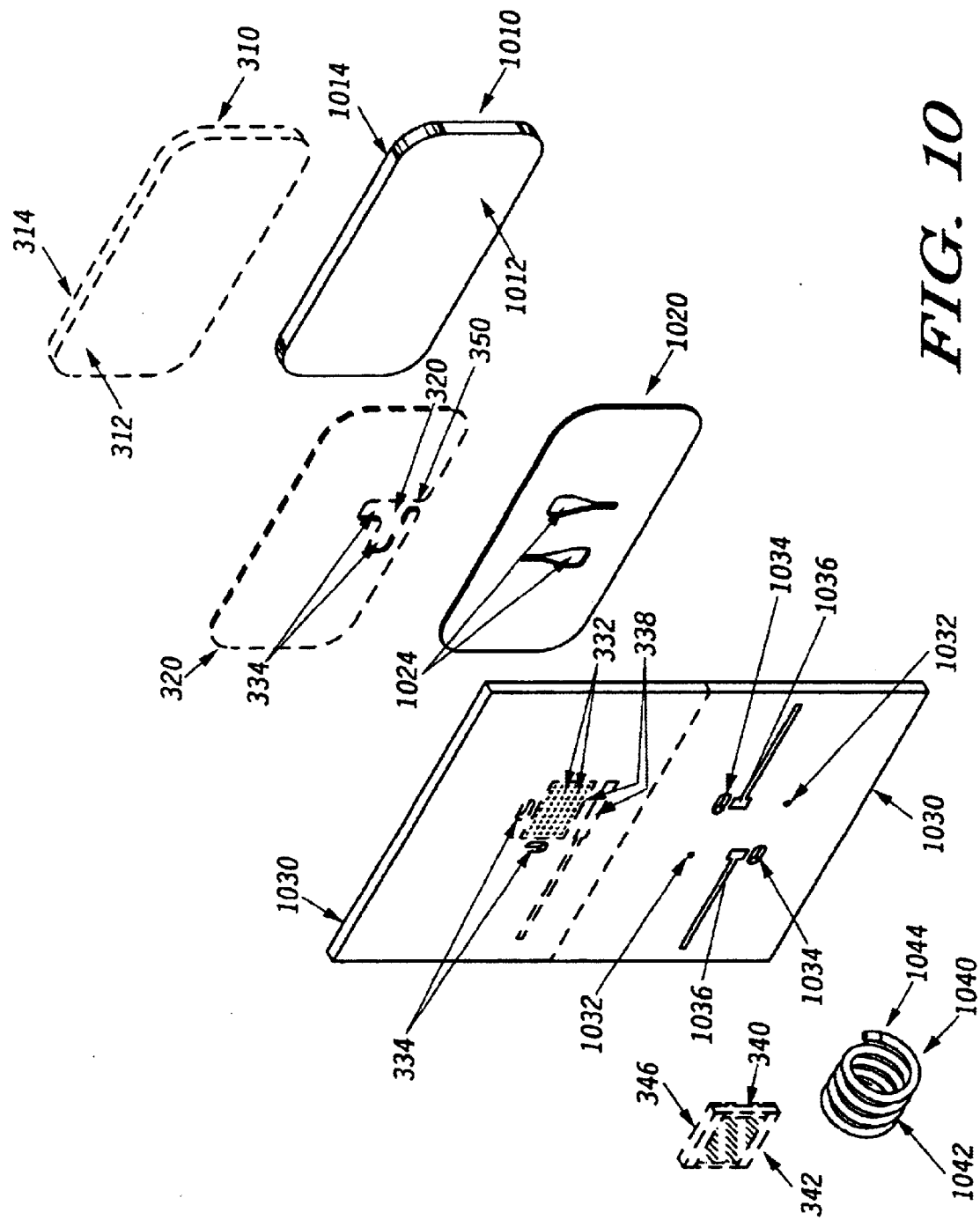
FIG. 10 illustrates an exploded view of electrical circuit apparatus including a heat sink, an adhesive layer, a substrate, and a device in accordance with an embodiment of the present invention.

FIG. 10 illustrates an exploded view of electrical circuit apparatus 1000 in accordance with an embodiment of the present invention. Circuit apparatus 1000 includes a heat sink 1010, an adhesive layer 1020, a substrate portion 1030, and a device 1040. Heat sink 1010 is comprised of a suitable high thermal conductive material such as, for instance, copper or aluminum, that allows wetting of solder and attachment of adhesive materials selected for the circuit apparatus assembly process. Heat sink 1010 has two primary sides 1012 and 1014. At side 1012: substrate portion 1030 is attached using adhesive layer 1020; device 1040 is attached using solder; and heat is input into heat sink 1010 for dissipation. The opposite side 1014 is the primary region of heat extraction from circuit apparatus 1000, as well as the primary mounting surface for circuit apparatus 1000. In one embodiment, the size of the heat sink is larger than that of the heat dissipating device (e.g., device 1040), such that desirable heat spreading can be achieved.

Adhesive layer 1020 is in accordance with the adhesive layer as described by reference to FIG. 9. Accordingly, adhesive layer 1020 includes solder apertures 1024. Substrate portion 1030 is in accordance with the substrate portion as described by reference to FIG. 8. Accordingly, substrate portion 1030 includes venting holes 1032, solder apertures 1034, and a ground layer 1036. Substrate 1030 also typically includes a plurality of pads 1036 on the topside of the substrate onto which the device 1040 may be coupled. In the embodiment illustrated in FIG. 10, ground layer 1036 comprises the bottom side of substrate 1030. However, it is realized that ground layer 1036 may be internal to substrate 1030, wherein substrate 1030 would further include a recess for exposing the ground layer, the recess typically having dimensions that are slightly larger than that of heat sink 1010. Finally, device 1040 may comprise at least one input terminal 1042 and at least one output terminal 1044. Device 1040 may be, for instance, an inductive coil or any device that is mounted to the top side substrate portion 1030 and that requires thermal coupling with heat sink 1010 but that further requires an electrical isolation from heat sink 1010.

The above-described elements of circuit apparatus 1000 may be assembled as follows in accordance with the present invention. Adhesive layer 1020 is aligned with substrate 1030 such that solder apertures 1024 are aligned with solder apertures 1034 and with venting holes 1032. Heat sink 1010 is mechanically coupled to the ground layer 1036 of substrate 1030 using adhesive layer 1020, such that it is aligned with substrate 1030. In the embodiment illustrated in FIG. 10, heat sink 1010 is coupled locally to substrate 1030 in an area that completely surrounds device 1040 for providing an optimal thermal conduction path.

Solder is placed on the substrate pads and into at least a portion of the adhesive layer solder apertures 1024 for subsequent solder wetting to couple the device input and output terminals (1042, 1044) to the pads, to couple the ground layer 1036 to the heat sink 1010 and to produce thermal coupling of device 1040. Typically, solder paste is screen-printed on the substrate pads and into the adhesive layer solder apertures 1024. However, in other embodiments, other forms of solder, e.g., solder pellets or pre-forms, may be implemented. It is further appreciated that during solder addition, solder may also be added to at least a portion of the substrate solder apertures 1034. In fact, typically both the substrate and adhesive layer solder apertures (1024, 1034) are filled during solder addition.

Device 1040 is mounted onto the topside of substrate 1030 such that at least one input terminal 1042 comes into contact with the solder on the corresponding pads on the topside of substrate 1030 and at least one output terminal 1044 comes into contact with the solder on the corresponding pads on the topside of substrate 1030. Population of the substrate 1030 with the device 1040 may be done manually, but is typically done using an automated process for efficiency and cost effectiveness during the manufacturing process.

The populated substrate 1030 may be placed in a reflow oven and thereafter cooled, wherein a solder connection between the device terminals (1042, 1044) and the pads is completed and solder wets from the solder apertures (1024, 1034) into the cavity between the ground layer 1036 and the heat sink 1010 to produce a thermal path between device 1040 and heat sink 1010.

In one embodiment, at least a portion of the steps of the method according to the present invention described above may be performed as part of an automated process, and ideally all of the steps are so performed. However, it is realized that any of the above described steps in various combinations may be performed manually or as part of an automated process.

Mechanical attachment of the heat sink to the substrate prior to reflow eliminates the need for fixtures to hold the heat sink in place during the SMT processing and adds robustness during the assembly process for handling of the circuit apparatus assembly. Assembly of the electrical circuit apparatus may be performed during a single pass reflow process for the thermal coupling and topside SMT attachment, thereby lending itself well with the use of no-lead solder or leaded solder.

The adhesive layer solder apertures, the substrate ground layer and the wettable heat sink surface promote wetting of solder from the solder apertures to areas of critical thermal coupling during reflow. High surface energy surfaces above (substrate ground layer) and below (heat sink) promote the wetting of solder to the open space between the two wettable surfaces. These surfaces also provide ideal adhesive bonding surfaces yielding high adhesion strength between the heat sink and the substrate.

Use of a film adhesive with controlled thickness produces a highly repeatable separation, resulting in lower variation of this critical dimension for the manufacturing process. A venting feature may be created by extending the adhesive cut-out region to the edge of the circuit board or through at least one venting hole formed in the circuit board. This feature further promotes optimal solder filling in the separation by allowing solder paste volatiles to escape during reflow. The size and shape of the solder apertures for the paste also defines the volume of molten solder to fill the separation and is easily controlled to optimize heat transfer. The combination of this control of solder volume and the termination of the region of two high surface energy surfaces created by the cut-outs in the adhesive restricts the flow of molten solder to the region of interest. The resulting ground layer-to-heat sink solder connection produces a repeatable thermal path from the heat dissipation component to the heat sink.

Since the bulk of the attachment of the heat sink to the substrate is accomplished using a low-stiffness adhesive, thermal expansion differences between the heat sink and matching components on top of the substrate (e.g., ceramic components, such as RF matching capacitors, that have a much lower coefficient of thermal expansion than the heat sink) are decoupled, thus improving the reliability of the components and corresponding solder joints. Moreover, the thermal apertures enable a good thermal conduction path between the bottom of the device and the heat sink.

FIG. 10, for simplicity, illustrates a portion of a substrate having one component mounted thereon using methods described above in accordance with the present invention. However, those of ordinary skill in the art will realize that a substrate typically has a plurality of components mounted thereon and includes, for instance, power components, ceramic load resistors, inductive coils and other components. Thus, in another aspect of the present invention, an electrical circuit apparatus may have heat sinks incorporated therein having different CTE values. For instance at least one heat sink having a low CTE may be coupled to the substrate beneath a low-CTE component such as, for instance, a ceramic load resistor, and at least one heat sink having a higher CTE may be coupled to the substrate under another high-CTE component such as, for instance, a radio frequency ("RF") or power transistor. Those of ordinary skill in the art will further realize that although FIG. 10 illustrates heat sink 1010 being coupled locally to substrate 1030 beneath only one device 1040, typically heat sink 1010 is coupled locally beneath a plurality of devices for efficiency in manufacturing and to minimize manufacturing costs. In addition, FIG. 10 only shows one heat sink being coupled to substrate 1030. However, it is appreciated that a plurality of heat sinks may be coupled to the substrate.

Figure 11:
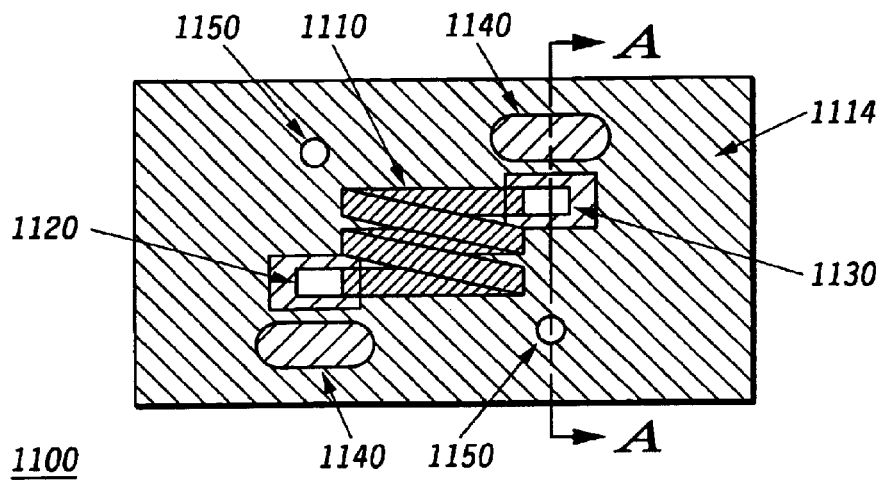
FIG. 11 illustrates an assembled topside view of electrical circuit apparatus in accordance with an embodiment of the present invention.

FIG. 11 illustrates an assembled topside view of an electrical circuit apparatus 1100, in accordance with the electrical circuit apparatus illustrated in FIG. 10, subsequent to a solder paste screening and device population but prior to solder wetting. Illustrated in FIG. 11 is the topside of a device 1110 that has been mounted onto a substrate 1114, wherein the topside of at least one device input terminal 1120 and at least one device output terminal 1130 have made contact with the solder on the input and output pads (not shown) on the topside of the substrate 1114. Also illustrated are two venting holes 1150, two solder apertures 1140 that have been filled with solder using known methods, and a cross-section line labeled A—A that illustrates a cross-sectional area of the electrical circuit apparatus 1100 that will be discussed in detail by reference to FIGS. 12 and 13.

Figure 12:
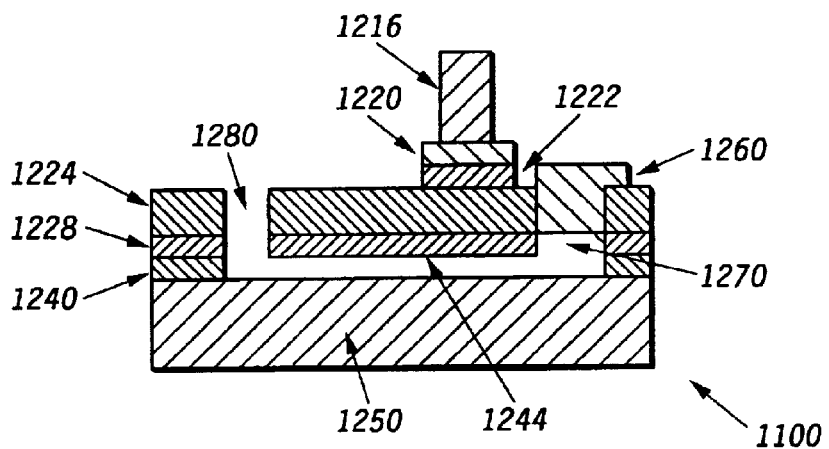
FIG. 12 illustrates a cross-sectional view at a section A—A of the electrical circuit apparatus illustrated in FIG. 11 prior to solder wetting.

FIG. 12 illustrates a cross-sectional view at a section A—A of the electrical circuit apparatus 1100 illustrated in FIG. 11 prior to solder wetting. This cross-sectional view illustrates at least one output terminal 1216 of a device coupled to a pad 1222 on a substrate 1224 via a solder layer 1220. A ground layer 1228 of substrate 1224 is mechanically coupled to a heat sink 1250 via an adhesive layer 1240, wherein the adhesive layer 1240 creates a precise cavity 1244 between the ground layer 1228 and heat sink 1250. Further illustrated is a venting hole 1280 and solder 1260 that has been added, using known methods, into a solder aperture 1270.

Figure 13:
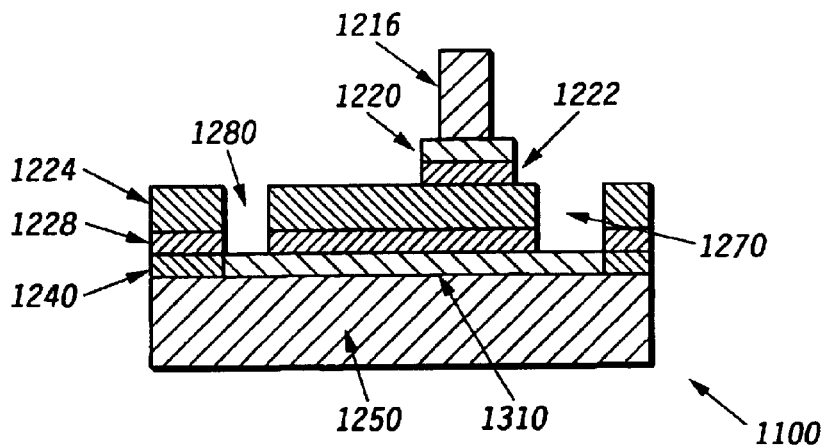
FIG. 13 illustrates a cross-sectional view at a section A—A of the electrical circuit apparatus illustrated in FIG. 11 subsequent to solder wetting.

FIG. 13 illustrates a cross-sectional view at a section A—A of the electrical circuit apparatus 1100 illustrated in FIG. 11 subsequent to solder wetting. Those elements that are identical to the elements illustrated in FIG. 12 are correspondingly identically labeled in FIG. 13 and for the sake of brevity are not described again here. FIG. 13, however, further illustrates solder wetting 1310 from solder aperture 1270 toward venting hole 1280 in an area between the ground layer 1228 of the substrate 1224 and the heat sink 1250, for thermal coupling of the device to heat sink 1250.

A number of exemplary advantages over the prior art can be realized using the method and electrical circuit apparatus of the present invention, wherein power devices may be mounted to a circuit board. These advantages include, but are not limited to: (1) minimization of CTE mismatch problems, for instance, between ceramic capacitors and the heat sink, by using a flexible, low-stiffness adhesive; (2) repeatable solder attachment of the ground layer of the circuit board to the heat sink directly under the device; (3) electrical isolation of device terminals from ground, i.e., the heat sink; (4) mechanical attachment of the heat sink to the circuit board to add robustness to assembly for handling and subsequent module assembly; (5) elimination of the need for fixtures in a one-step or single pass reflow soldering process that lends itself to no-lead solder or leaded solder; and (6) solder attachment for thermal management can be accomplished during SMT attachment of other components to the circuit board without requiring additional process steps.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

What is claimed is:

1. An electrical circuit apparatus comprising;
   a substrate comprising a top side, a ground layer, at least one thermal aperture, and at least one solder aperture;
   a heat sink; and
   an adhesive layer for mechanically coupling said heat sink to the ground layer of said substrate such that at least a portion of said at least one substrate thermal aperture overlaps said heat sink, said adhesive layer comprising at least one thermal aperture and at least one solder aperture, wherein aligning the at least one substrate solder aperture with the at least one adhesive layer solder aperture and aligning the at least one substrate thermal aperture with the at least one adhesive layer thermal aperture enables solder wetting in a predetermined area between said heat sink and the ground layer of said substrate.

2. The apparatus of claim 1 further comprising a device coupled to the top side of said substrate such that at least a portion of said device covers at least a portion of said at least one substrate thermal aperture, and wherein said device is coupled to said heat sink via at least a portion of said at least one substrate thermal aperture.

3. The apparatus of claim 2, wherein said device comprises at least one input terminal and a ground flange, and at least a portion of said predetermined area is located beneath the ground flange of said device.

4. The apparatus of claim 2, wherein said heat sink has a coefficient of thermal expansion that is essentially matched to that of said device.

5. The apparatus of claim 2, wherein said device is a ceramic device.

6. The apparatus of claim 2, wherein said device is coupled to said substrate and said heat sink and said solder wetting occurs during a single pass solder reflow process.

7. The apparatus of claim 6, wherein said solder reflow process uses a no-lead solder.

8. The apparatus of claim 6, wherein said solder reflow process uses a leaded solder.

9. The apparatus of claim 1, wherein said adhesive layer comprises an electrically non-conducting material.

10. The apparatus of claim 9, wherein said electrically non-conductive material is acrylic.

11. The apparatus of claim 1, wherein said substrate is an organic circuit board.

12. The apparatus of claim 1, wherein said adhesive layer has a predetermined thickness.

13. The apparatus of claim 1, wherein said adhesive layer further comprises at least one venting aperture located on a predetermined area of said adhesive layer to enable the escape of solder volatiles during solder reflow.

14. The apparatus of claim 13, wherein said predetermined area is adjacent to said adhesive layer thermal aperture.

15. An electrical circuit apparatus comprising;
    a substrate comprising a top side, a ground layer, at least one thermal aperture, and at least one solder aperture;
    a heat sink;
    an adhesive layer for mechanically coupling said heat sink to the ground layer of said substrate such that at least a portion of said at least one substrate thermal aperture overlaps said heat sink, said adhesive layer comprising at least one thermal aperture and at least one solder aperture; and
    a device coupled to the top side of said substrate such that at least a portion of said device covers at least a portion of said at least one substrate thermal aperture, and wherein said device is coupled to said heat sink via at least a portion of said at least one thermal aperture, and wherein aligning the at least one substrate solder aperture with the at least one adhesive layer solder aperture and aligning the at least one substrate thermal aperture with the at least one adhesive layer solder aperture enables solder wetting in a predetermined area between said heat sink and the ground layer of said substrate, and wherein at least a portion of said predetermined area is located beneath said device.

16. An electrical circuit apparatus comprising;
    an organic circuit board comprising a top side, a ground layer, at least one thermal aperture, and at least one solder aperture;

a heat sink;

an adhesive layer for mechanically coupling said heat sink to the ground layer of said substrate such that at least a portion of said at least one substrate thermal aperture overlaps said heat sink, said adhesive layer having a predetermined thickness and comprising at least one thermal aperture, at least one solder aperture and at least one venting aperture adjacent to the at least one adhesive layer thermal aperture; and a device comprising at least one input terminal and a ground flange and coupled to the top side of said substrate such that at least a portion of said device covers at least a portion of said at least one substrate thermal aperture, and wherein said device is coupled to said heat sink via at least a portion of said at least one substrate thermal aperture, and wherein aligning the at least one substrate solder aperture with the at least one adhesive layer solder aperture and aligning the at least one substrate thermal aperture with the at least one adhesive layer thermal aperture enables solder wetting in a predetermined area between said heat sink and the ground layer of said substrate, and wherein at least a portion of said predetermined area is located beneath the ground flange of said device.

17. An electrical circuit apparatus comprising;

a substrate comprising a top side, a ground layer, and at least one solder aperture;

a heat sink; and an adhesive layer for mechanically coupling said heat sink to the ground layer of said substrate, said adhesive layer comprising at least one solder aperture, wherein aligning the at least one substrate solder aperture with the at least one adhesive layer solder aperture enables solder wetting in a predetermined area between said heat sink and the ground layer of said substrate.

18. The apparatus of claim 17 further comprising a device coupled to the topside of said heat sink.

19. The apparatus of claim 18, wherein at least a portion of said predetermined area is located beneath said device.

20. The apparatus of claim 18, wherein said device is an inductive coil.

21. The apparatus of claim 17, wherein said adhesive layer comprises an electrically non-conducting material.

22. The apparatus of claim 21, wherein said electrically non-conductive material is acrylic.

23. The apparatus of claim 17, wherein said substrate is an organic circuit board.

24. The apparatus of claim 17, wherein said adhesive layer has a predetermined thickness.

25. The apparatus of claim 17, wherein said substrate further comprises at least one venting hole that is aligned with said at least one adhesive layer solder aperture to enable the escape of solder volatiles during said solder wetting.

26. An electrical circuit apparatus comprising;

a substrate comprising a top side, a ground layer, and at least one solder aperture;

a heat sink;

an adhesive layer for mechanically coupling said heat sink to the ground layer of said substrate, said adhesive layer comprising at least one solder aperture; and a device coupled to the topside of said heat sink, wherein aligning the at least one substrate solder aperture with the at least one adhesive layer solder aperture enables solder wetting in a predetermined area between said heat sink and the ground layer of said substrate, and wherein at least a portion of said predetermined area is located beneath said device.

27. An electrical circuit apparatus comprising;

an organic circuit comprising a top side, a ground layer, at least one solder aperture, and at least one venting hole;

a heat sink;

an adhesive layer for mechanically coupling said heat sink to the ground layer of said substrate, said adhesive layer having a predetermined thickness and comprising at least one solder aperture; and a device coupled to the topside of said heat sink, wherein aligning the at least one substrate solder aperture and the at least one venting hole with the at least one adhesive layer solder aperture enables solder wetting in a predetermined area between said heat sink and the ground layer of said substrate, and wherein at least a portion of said predetermined area is located beneath said device.

28. An electrical circuit apparatus comprising;

a substrate comprising a top side, a ground layer, and at least one solder aperture;

a first heat sink having a first coefficient of thermal expansion ("CTE");

a second heat sink having a second CTE that is lower than said first CTE; and at least one adhesive layer for mechanically coupling said heat sinks to the ground layer of said substrate, said adhesive layer comprising at least one solder aperture, wherein aligning said at least one substrate solder aperture with said at least one adhesive layer solder aperture enables solder wetting in a first predetermined area between said first heat sink and the ground layer of said substrate and in a second predetermined area between said second heat sink and the ground layer of said substrate.

29. The apparatus of claim 28 further comprising a first device coupled to the topside of said substrate such that at least a portion of said first device overlaps said first heat sink and a second device coupled to the topside of said second heat sink such that at least a portion of said second device overlaps said second heat sink and wherein the CTE of said second heat sink is essentially matched to a CTE of said second device.

30. The apparatus of claim 29, wherein said first device is a power device, and said second device is a ceramic device.

31. The apparatus of claim 30, wherein said first device is a radio frequency transistor, and said second device is a load resistor.

* * * * *

UNITED STATES PATENT AND TRADEMARK OFFICE
CERTIFICATE OF CORRECTION

PATENT NO. : 6,861,746 B1
DATED : March 1, 2005
INVENTOR(S) : Waldvogel et al.

It is certified that error appears in the above-identified patent and that said Letters Patent is hereby corrected as shown below:

Drawings,
Figure 3, (middle drawing) change "334" to -- 324 --.

Column 14,
Line 19, change "solder" to -- thermal --.

Signed and Sealed this

Fourteenth Day of February, 2006

JON W. DUDAS
*Director of the United States Patent and Trademark Office*